(12) United States Patent
Lin

(10) Patent No.: US 8,631,856 B2
(45) Date of Patent: Jan. 21, 2014

(54) STRESS EQUALIZED HEAT SINK UNIT WITH TIGHTENING DEVICE

(75) Inventor: Sheng-Huang Lin, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 381 days.

(21) Appl. No.: 12/459,220

(22) Filed: Jun. 29, 2009

(65) Prior Publication Data

US 2010/0181059 A1 Jul. 22, 2010

(30) Foreign Application Priority Data

Jan. 19, 2009 (TW) ................ 98200961 U

(51) Int. Cl.
*F28F 7/00* (2006.01)
*H05K 7/20* (2006.01)

(52) U.S. Cl.
USPC ............. 165/80.3; 165/104.33; 361/704

(58) Field of Classification Search
USPC ............... 361/704; 165/104.33, 80.3
See application file for complete search history.

(56) References Cited

U.S. PATENT DOCUMENTS

| | | | |
|---|---|---|---|
| 5,360,317 A | 11/1994 | Clausen et al. | 415/206 |
| 5,969,949 A * | 10/1999 | Kim et al. | 361/704 |
| 6,390,475 B1 * | 5/2002 | Eckblad et al. | 277/312 |
| 6,496,371 B2 * | 12/2002 | Winkel et al. | 361/703 |
| 7,275,587 B2 * | 10/2007 | Kuo | 165/80.3 |
| 7,441,592 B2 * | 10/2008 | Huang | 165/104.33 |
| 7,724,525 B2 * | 5/2010 | Zha | 361/704 |
| 7,746,646 B2 * | 6/2010 | Kuo et al. | 361/709 |
| 2003/0121643 A1 * | 7/2003 | Connors | 165/80.3 |
| 2004/0200600 A1 * | 10/2004 | Chen et al. | 165/80.3 |
| 2004/0257770 A1 * | 12/2004 | Hu | 361/704 |
| 2006/0034057 A1 * | 2/2006 | Yang | 361/704 |
| 2006/0146498 A1 * | 7/2006 | Shih-Tsung | 361/704 |
| 2007/0025083 A1 * | 2/2007 | Lin | 361/704 |
| 2007/0044942 A1 * | 3/2007 | Mou | 165/104.33 |
| 2007/0091573 A1 * | 4/2007 | Yang | 361/704 |
| 2007/0115638 A1 * | 5/2007 | Yu et al. | 361/704 |
| 2007/0139891 A1 * | 6/2007 | Yu et al. | 361/704 |
| 2008/0030958 A1 * | 2/2008 | Lai et al. | 361/704 |
| 2008/0084670 A1 * | 4/2008 | Fu et al. | 361/704 |
| 2008/0094801 A1 * | 4/2008 | Lien et al. | 361/704 |
| 2008/0137305 A1 * | 6/2008 | Yan | 361/709 |
| 2008/0273301 A1 * | 11/2008 | Lin | 361/687 |
| 2009/0009972 A1 * | 1/2009 | Ho | 361/704 |
| 2009/0034199 A1 * | 2/2009 | Yu et al. | 361/704 |
| 2010/0271786 A1 * | 10/2010 | Yeh et al. | 361/720 |

\* cited by examiner

*Primary Examiner* — Brandon M Rosati
(74) *Attorney, Agent, or Firm* — C. G. Mersereau; Nikolai & Mersereau, P.A.

(57) ABSTRACT

A stress equalized heat sink unit includes a radiating fin assembly having a plurality of radiating fins and a stress equalizing element. A vertical receiving hole extends from a top of the radiating fin assembly to a predetermined depth. The stress equalizing element is positioned on the bottom of the receiving hole with one side facing away from the bottom of the receiving hole that serves as a pressure receiving face. When a tightening device fitted on fin assembly applies a downward pressure on the pressure receiving face, the applied pressure is uniformly dispersed via the pressure receiving face and the radiating fins to avoid deformation of the radiating fins due to stress concentration.

4 Claims, 13 Drawing Sheets

STRESS EQUALIZED HEAT SINK UNIT WITH TIGHTENING DEVICE

FIELD OF THE INVENTION

The present invention relates to a heat sink unit, and more particularly to a stress equalized heat sink unit having a stress equalizing element that helps in uniform stress dispersing and protects radiating fins of the heat sink unit against deformation due to stress concentration when the radiating fins are tightened together with a tightening device.

BACKGROUND OF THE INVENTION

Various kinds of electronic information products, such as computers, are now widely adopted and applied in different commercial and industrial fields. To meet consumers' demands, electronic information products have been designed to have high operating speed and increased access capacity. However, components in the electronic information products would produce a high amount of heat when they operate at high speed.

For example, among others, the central processing unit (CPU) of a computer produces the largest part of heat in the computer. When the heat produced by the CPU gradually increases, the computer would have reduced performance. And, when the produced heat has accumulated in the computer to exceed an allowable limit, the computer is subject to the danger of shutdown or even becoming seriously damaged. Moreover, to solve the problem of electromagnetic radiation, a case is usually used to enclose all the important computer components or elements therein. Therefore, it is a very important matter to quickly dissipate the heat produced by the CPU and other heat-producing elements in the computer case.

A common way to dissipate the heat produced by the CPU is to mount a heat sink atop the CPU. The heat sink has a first side formed with a plurality of radiating fins. An opposite second side of the heat sink without the radiating fins is indirect contact with the CPU, so that heat produced by the CPU is absorbed by the heat sink at the second side contacting with the CPU and then transferred to the radiating fins at the first side and finally radiated from the radiating fins into ambient air. Or, a cooling fan can be additionally mounted to produce airflows to carry away hot air around the CPU and the heat sink, so as to achieve the purpose of quick heat dissipation. The radiating fins must be fixedly located on the heat sink to space from one another.

FIGS. 1 and 1A are exploded and assembled perspective views, respectively, of a conventional heat sink unit 1, which includes a plurality of stacked radiating fins 11, at least one heat pipe 111 extended through the radiating fins 11, a tightening body 12 fitted around the stacked radiating fins 11, and a binder 13 fixedly bound around the stacked radiating fins 11. The tightening body 12 is provided at each of two ends with a hook member 121 for hooking to an insertion seat (not shown). A control lever 122 is connected to one of the hook members 121. The fixed binder 13 is in contact with a lower side of the tightening body 12. A user can operate the control lever 122 to apply a downward pressure on the tightening body 12, bringing the tightening body 12 to downward press against the fixed binder 13. In the conventional heat sink unit 1, the pressure from the tightening body 12 is applied on the binder 13 via one single point, and the binder 13 provides a relatively small pressure receiving area while no other supporting means are provided below the binder 13 to support the same. As a result, stress is concentrated on the fixed binder 13 and could not be dispersed, which causes deformation of the radiating fins 11 being bound together by the fixed binder 13. Moreover, when the number of the radiating fins 11 of the heat sink unit 1 is increased, the binder 13 actually fails to effectively bind the radiating fins 11 for them to maintain at fixed position relative to one another. Therefore, the heat sink unit 1 with unstably located radiating fins 11 has poor heat dissipating efficiency. In brief, the conventional heat sink unit 1 has the following disadvantages: (1) the stress tends to concentrate on some of the radiating fins of the heat sink unit; (2) the stress could not be uniformly dispersed; (3) the radiating fins are subject to deformation; and (4) the heat sink unit is adversely affected to have low heat dissipating efficiency.

It is therefore tried by the inventor to develop an improved stress equalized heat sink unit to overcome the drawbacks in the conventional heat sink unit.

SUMMARY OF THE INVENTION

A primary object of the present invention is to provide a stress equalized heat sink unit that includes a radiating fin assembly having a receiving hole formed thereon for receiving a stress equalizing element therein, and the stress equalizing element is helpful in locating radiating fins of the radiating fin assembly in place.

Another object of the present invention is to provide a stress equalized heat sink unit that includes a stress equalizing element to protect radiating fins of the heat sink unit against deformation due to stress concentration when the radiating fins are tightened together with a tightening device that applies a downward pressure on the stress equalizing element.

To achieve the above and other objects of the present invention, the stress equalized heat sink unit according to the present invention includes a radiating fin assembly consisting of a plurality of radiating fans and a stress equalizing element. A part of the radiating fins are correspondingly cut at a predetermined position to form at least one receiving hole vertically downward extended from a top of the radiating fin assembly by a predetermined depth. The stress equalizing element is position on a bottom in the receiving hole to thereby locate the radiating fins in place.

The radiating fins are also correspondingly cut at other predetermined positions to form two spaced gaps for a tightening device to fit therein. One side of the stress equalizing element facing away from the bottom of the receiving hole serves as a pressure receiving face to receive downward pressure from the tightening device. When the tightening device is tightened against the radiating fin assembly and applies downward pressure on the pressure receiving face of the stress equalizing element, the applied pressure is uniformly dispersed via the pressure receiving face and the radiating fins without causeing deformation of the radiating fins due to stress concentration.

In brief, the stress equalized heat sink unit of the present invention provides the following advantages: (1) the stress equalizing element has increased area to receive the pressure from the tightening device; (2) the pressure applied by the tightening device on the heat sink unit is uniformly dispersed via the stress equalizing element and the radiating fins; (3) the problem of deformed radiating fins due to stress concentration is avoided; (4) the stress equalized heat sink unit can maintain good heat dissipating efficiency; and (5) the user's cost for replacing a damaged heat sink unit can be saved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
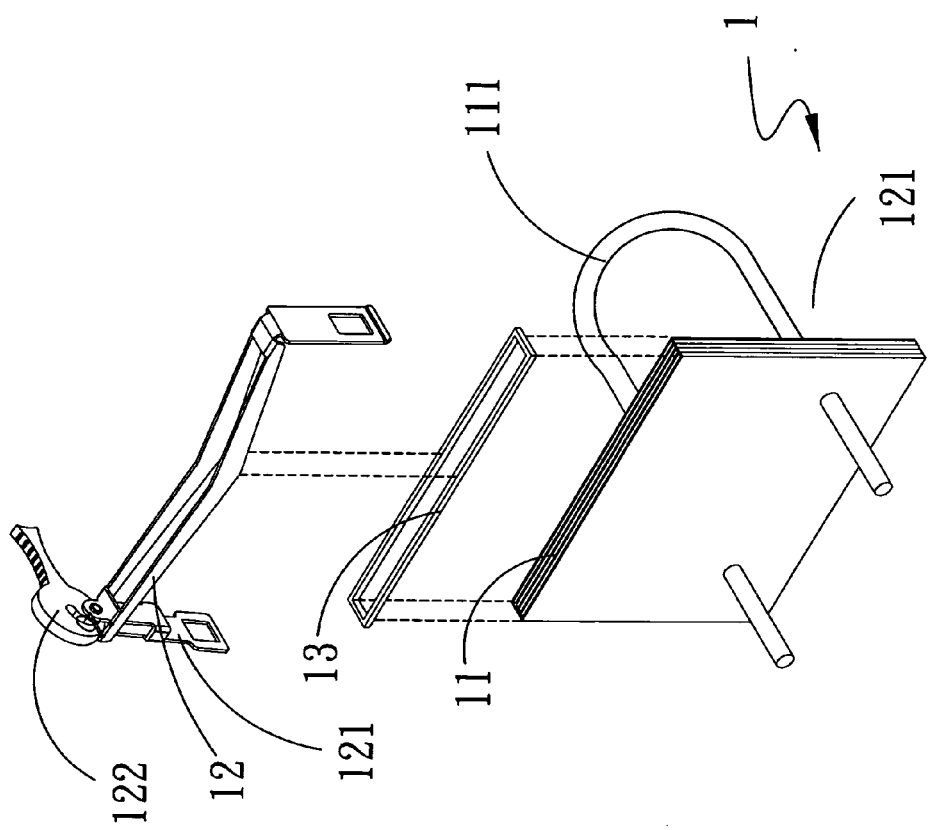
FIGS. 1 and 1A are exploded and assembled perspective views, respectively, of a conventional heat sink unit.
Figure 1A:
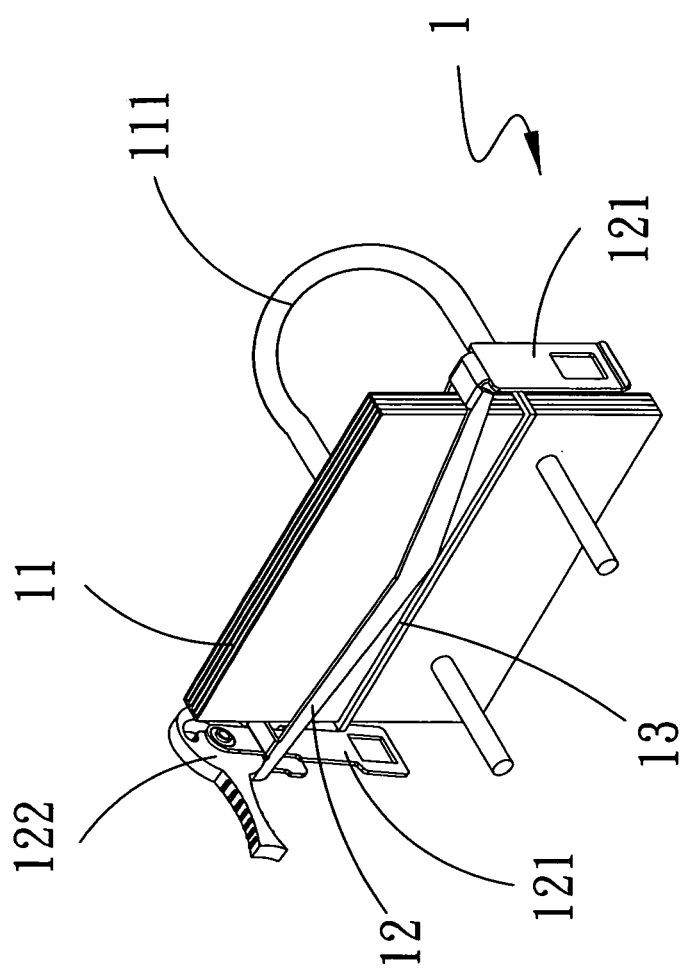
Figure 2:
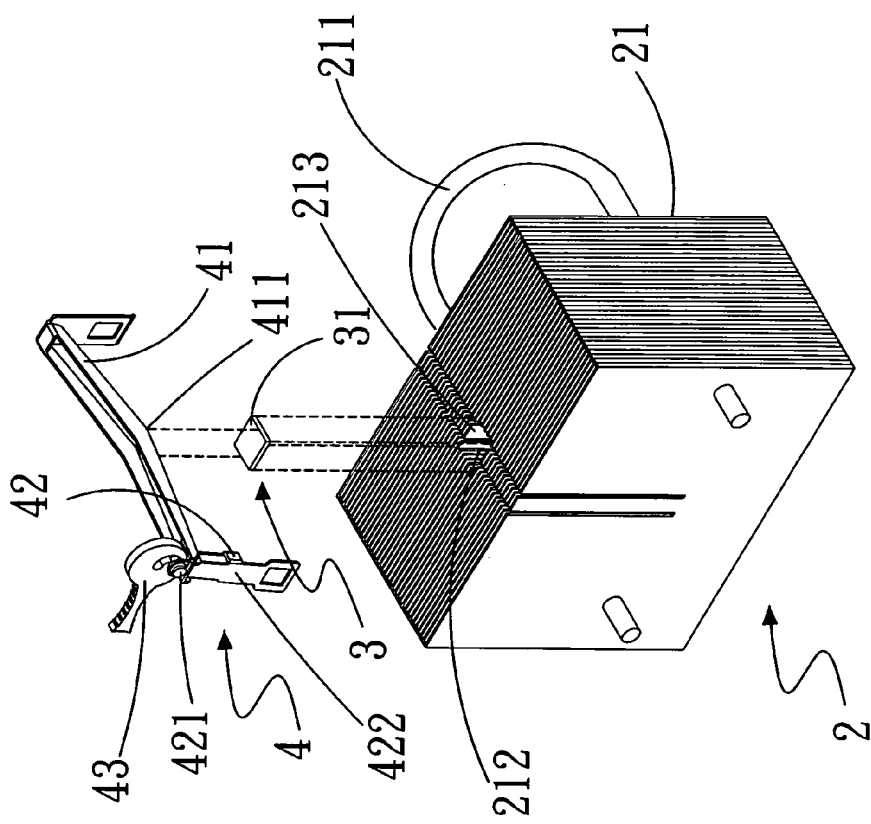
FIGS. 2 and 2A are exploded and assembled perspective views, respectively, of a stress equalized heat sink unit according to a preferred embodiment of the present invention.
Figure 2A:
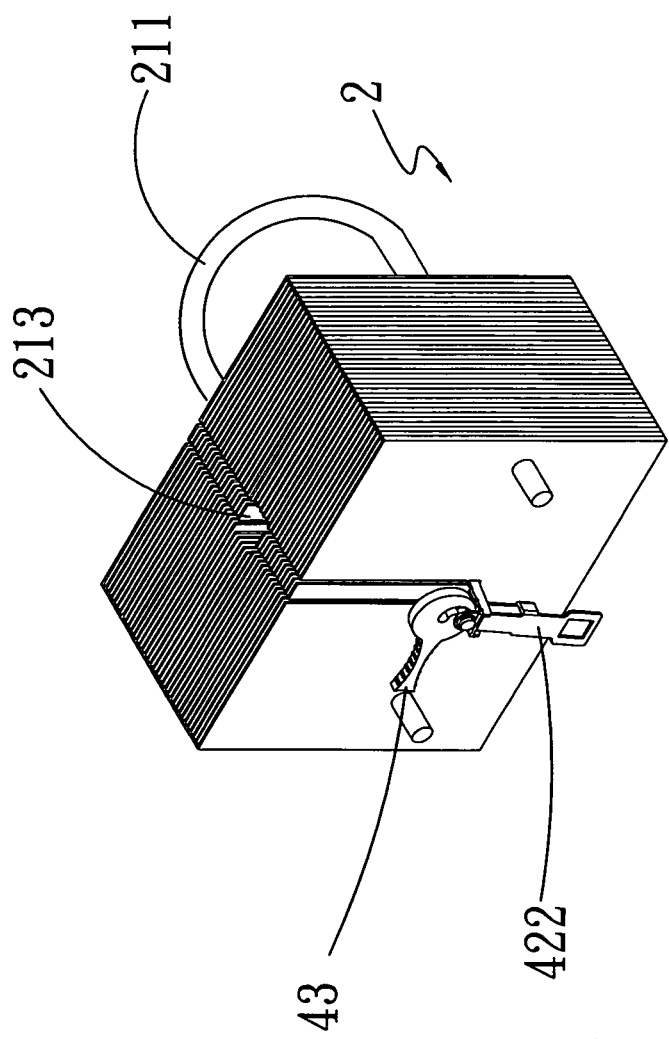

Please refer to FIGS. 2 and 2A that are exploded and assembled perspective views, respectively, of a stress equalized heat sink unit according to a preferred embodiment of the present invention. As shown, the stress equalized heat sink unit includes a radiating fin assembly 2, a stress equalizing element 3, and a tightening device 4.

The radiating fin assembly 2 consists of a plurality of 5 parallelly and symmetrically arranged radiating fins 21, and at least one heat pipe 211 extended through the radiating fins 21 to connect them to one another. Any two adjacent ones of the parallelly arranged radiating fins 21 are spaced from each other by a predetermined space 212. Part of the radiating fins 21 located near a middle portion of the radiating fin assembly 2 are correspondingly cut at predetermined position to thereby form at least one receiving hole 213 vertically downward extended from a top of the radiating fin assembly 2 by a predetermined depth. Meanwhile, the remaining radiating fins 21 are correspondingly cut at other predetermined positions, so that two parallelly spaced gaps are formed on the radiating fin assembly 2 to vertically downward extend from the top of the radiating fin assembly 2 by another depth smaller than that of the receiving hole 213. The two gaps are spaced by a distance smaller than a width of the receiving hole 213.

The stress equalizing element 3 is fitly positioned on a bottom in the receiving hole 213. An upper side of the stress equalizing element 3 facing away from the bottom of the receiving hole 213 serves as a large-area pressure receiving face 31.

The tightening device 4 includes a main body 41, a fastening section 42, and a control lever 43. The main body 41 can be fitted in the two spaced gaps formed on the radiating fin assembly 2 with two outer ends abutted on two opposite ends of the radiating fin assembly 2. A lower central portion of the main body 41 is formed into two downward protruded points 411 for pressing against the pressure receiving face 31 of the stress equalizing element 3. The fastening section 42 is provided at one end of the main body 41 and has a contact face 421, to where an upward and downward movable hook member 422 is connected. The control lever 43 is located at an upper end of the contact face 421.

Figure 3:
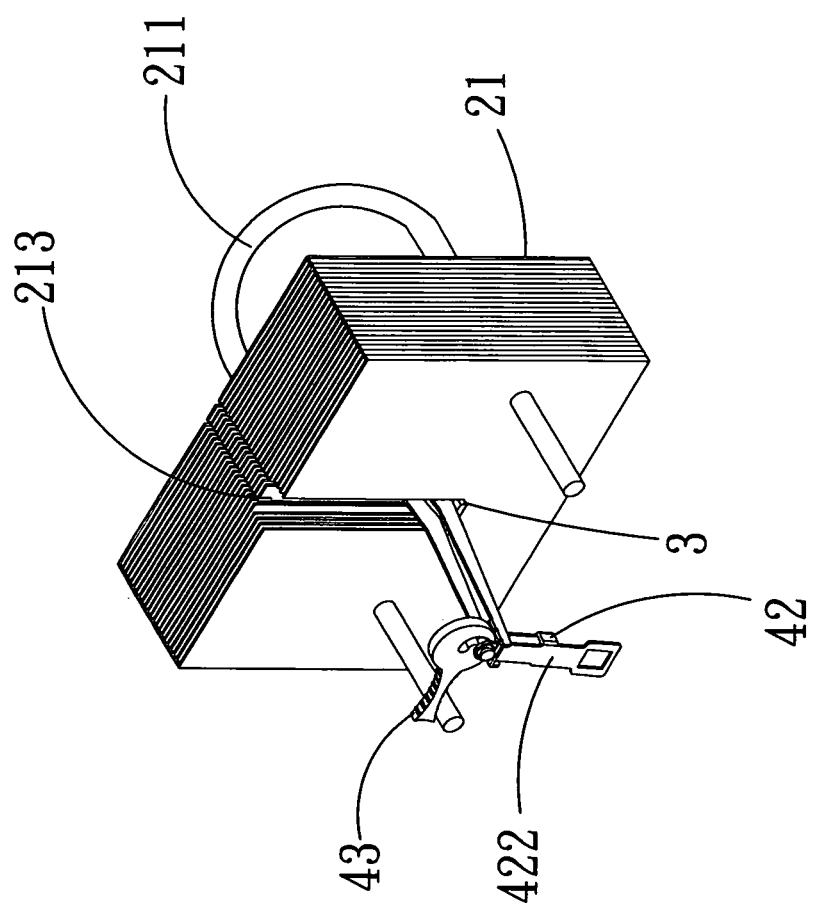
FIG. 3 is similar to FIG. 2A with part of the radiating fin assembly forming the heat sink unit being removed to better show an internal structure of the present invention.
Figure 4:
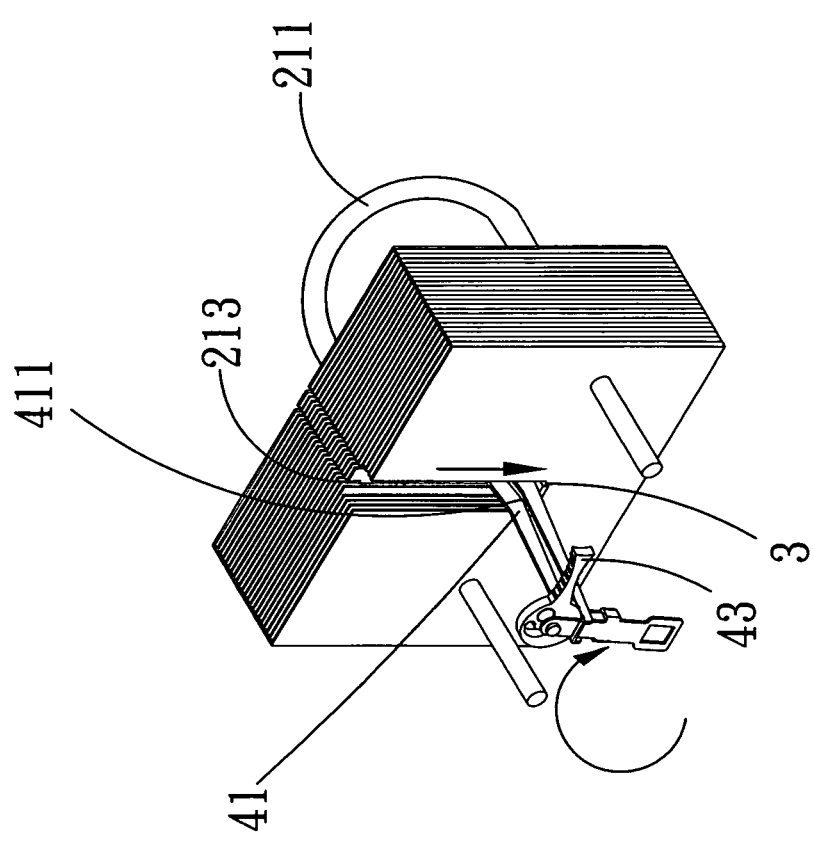
FIG. 4 is similar to FIG. 3 but with a control lever for the heat sink unit being downward pushed.

FIG. 3 is similar to FIG. 2A with part of the radiating fin assembly 2 being removed to better show an internal structure of the heat sink unit of the present invention; and FIG. 4 is similar to FIG. 3 but with the control lever 43 being downward pushed. Please refer to FIGS. 3 and 4 along with FIG. 2. The stress equalizing element 3 is positioned on the bottom in the receiving hole 213 on the radiating fin assembly 2 to stably contact with the radiating fins 21 adjoining the receiving hole 213. When the tightening device 4 is fully downward fitted in the two gaps, the downward protruded points 411 of the main body 41 are in contact with the pressure receiving face 31 of the stress equalizing element 3, and the fastening section 42 at one end of the main body 41 is located at one side of an insertion seat (not shown). The control lever 43 can be operated to bring the hook member 422 on the contact face 421 to firmly insert into the insertion seat, so that the tightening device 4 is firmly and stably pressed against the pressure receiving face 31 of the stress equalizing element 3. When the downward protruded central points 411 of the main body 41 of the tightening device 4 are brought to applying pressure to the pressure receiving face 31, the whole stress equalizing element 3 is in full contact with the bottom of the receiving hole 213. Therefore, the pressure applied by the fastened tightening device 4 to the stress equalizing element 3 is effectively and uniformly dispersed into the whole pressure receiving face 31 and the adjoining radiating fins 21, protecting the radiating fins 21 against deformation due to stress concentration.

Figure 5:
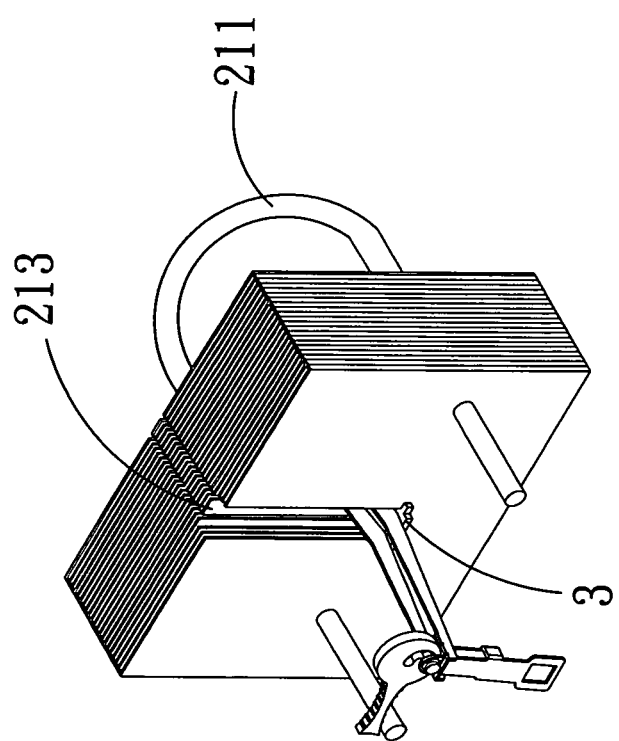
FIG. 5 is similar to FIG. 3 but includes a stress equalizing element according to a second embodiment of the present invention.
Figure 5A:
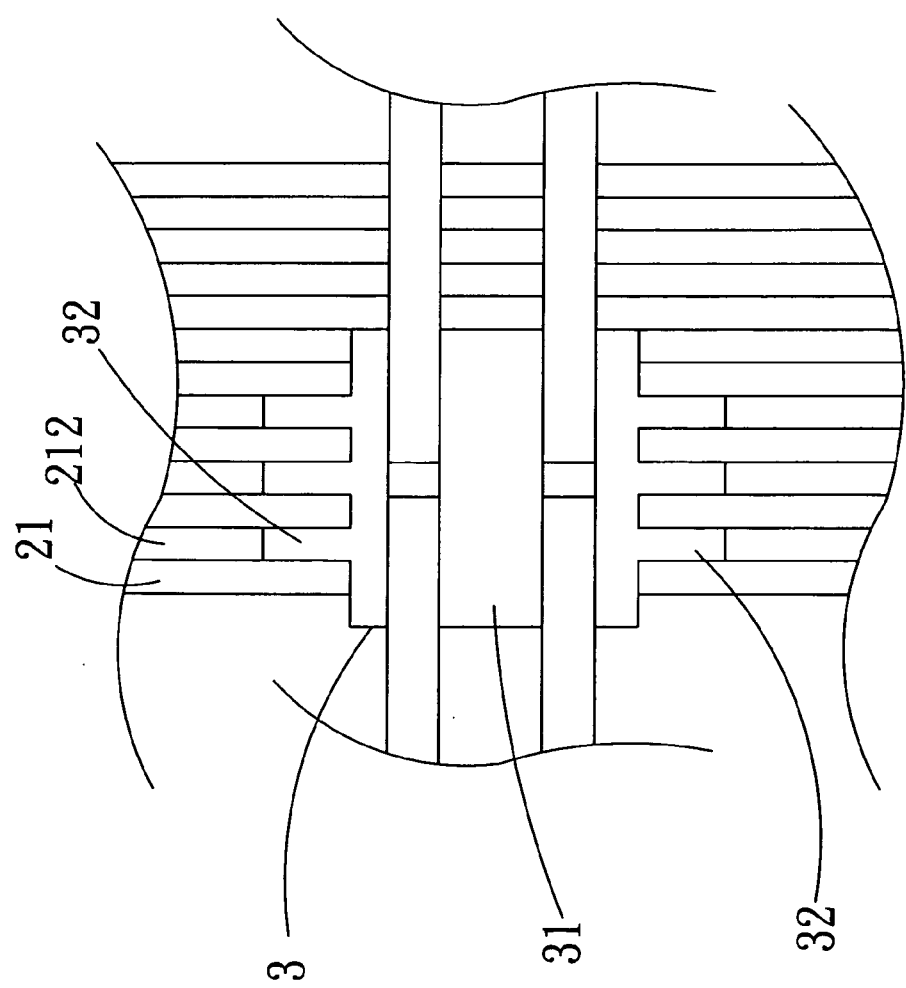
FIG. 5A is a fragmentary and enlarged top view of FIG. 5.

Please also refer to FIG. 5, in which a stress equalizing element 3 according to a second embodiment of the present invention is shown, and to FIG. 5A that is a fragmentary and enlarged top view of FIG. 5. The stress equalizing element 3 in the second embodiment is provided at each of two lateral sides with at least one laterally extended engaging head 32. The engaging head 32 has a width corresponding to the space 212 between two adjacent radiating fins 21. When the stress equalizing element 3 is positioned in the receiving hole 213, the engaging heads 32 at two lateral sides of the stress equalizing element 3 are separately fitly received in the corresponding spaces 212 between the radiating fins 21. Therefore, the engaging heads 32 not only enable the pressure applied to the stress equalizing element 3 to uniformly dispersed via the pressure receiving face 31 and the radiating fins 21 in contact with the stress equalizing element 3, but also help in locating the radiating fins 21 in place while preventing the stress equalizing element 3 from moving relative to the radiating fins 21.

Figure 6:
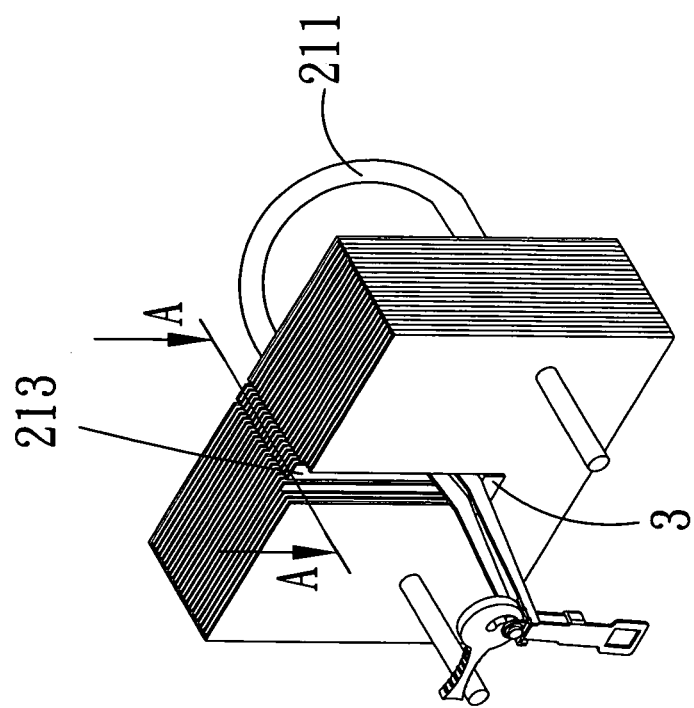
FIG. 6 is similar to FIG. 3 but includes a stress equalizing element according to a third embodiment of the present invention.
Figure 6A:
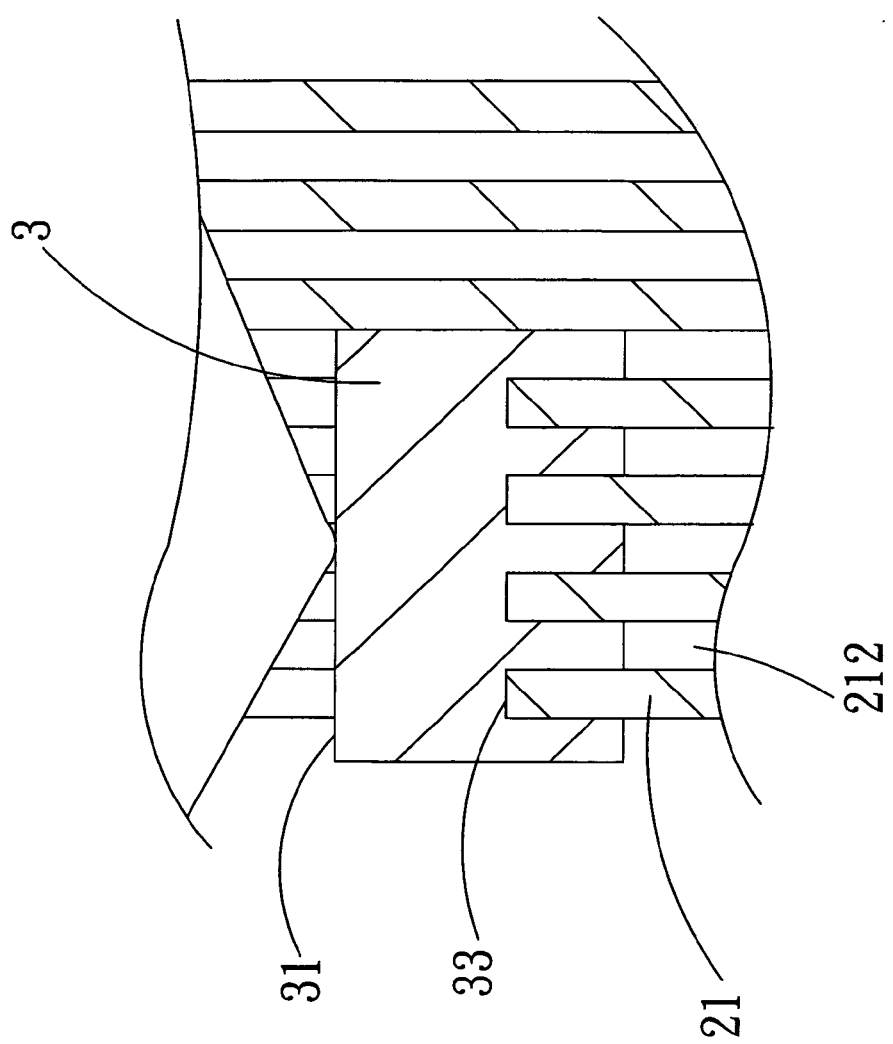
FIG. 6A is a fragmentary, enlarged sectional view taken along line A-A of FIG. 6.

Please also refer to FIG. 6, in which a stress equalizing element 3 according to a third embodiment of the present invention is shown, and to FIG. 6A that is a fragmentary, enlarged sectional view taken along line A-A of FIG. 6. The stress equalizing element 3 in the third embodiment is provided at one side opposite to the pressure receiving face 31 with a plurality of equally spaced recesses 33, which are so dimensioned and spaced that the radiating fins 21 adjoining that side of the stress equalizing element 3 are fitly received in the recesses when the stress equalizing element 3 is positioned in the receiving hole 213, and portions on that side of the stress equalizing element 3 spaced by the recesses 33 are separately extended into the spaces 212 between adjacent radiating fins 21. Therefore, the pressure applied to the stress equalizing element 3 by the tightening device 4 is uniformly dispersed via the pressure receiving face 31 and the radiating fins 21. Similarly, the recesses 33 also help in locating the radiating fins 21 in place and preventing the stress equalizing element 3 from moving relative to the radiating fins 21.

Figure 7A:
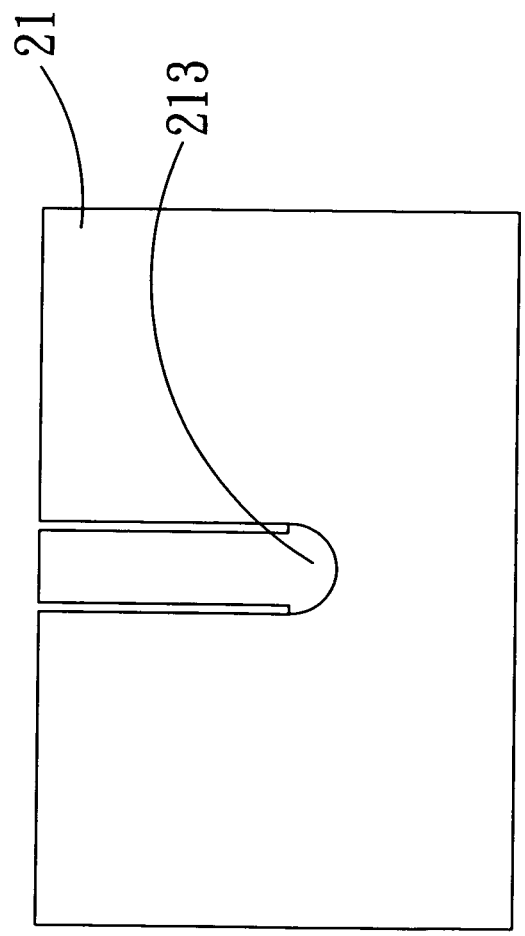
FIG. 7A is a schematic sectional view showing a first bottom shape for a receiving hole formed on the heat sink unit of the present invention.
Figure 7B:
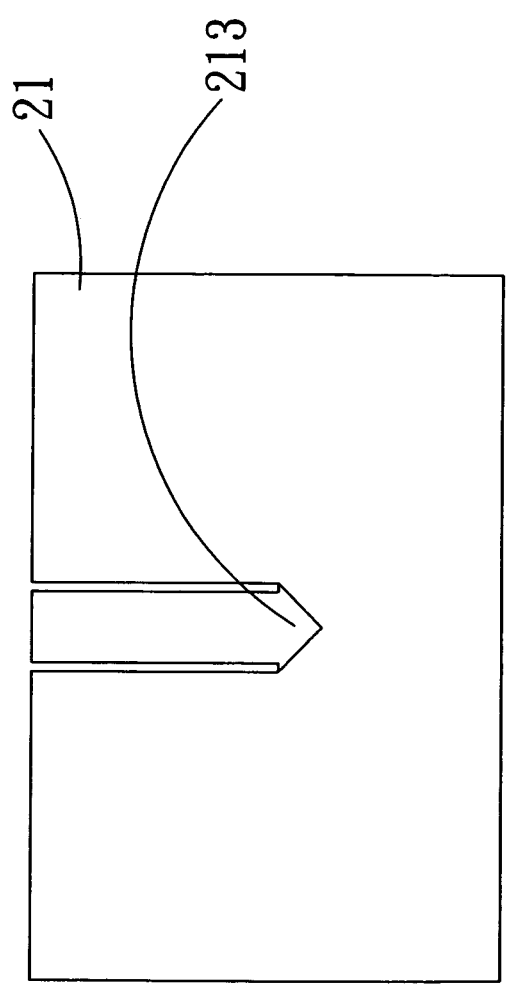
FIG. 7B is a schematic sectional view showing a second bottom shape for the receiving hole formed on the heat sink unit of the present invention.
Figure 7C:
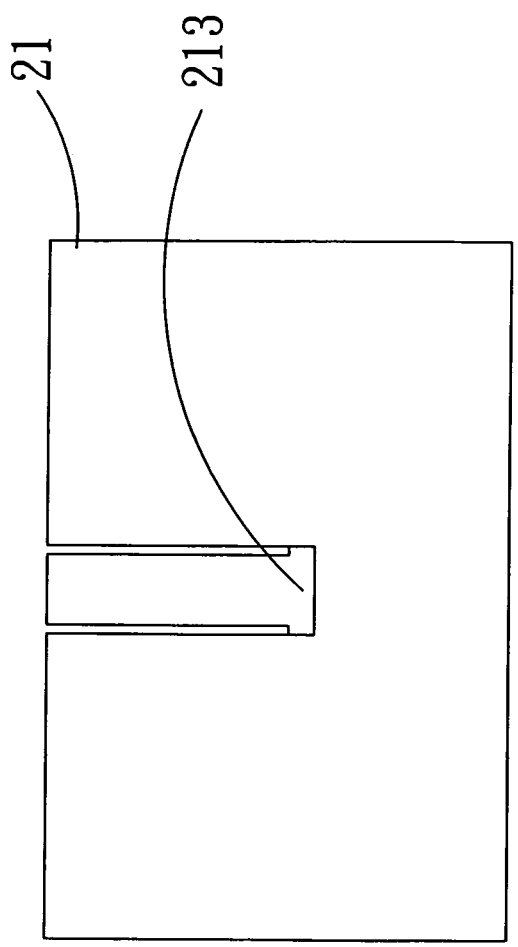
FIG. 7C is a schematic sectional view showing a third bottom shape for the receiving hole formed on the heat sink unit of the present invention.

In the present invention, the receiving hole 213 can have differently shaped bottom, such as a concave bottom, a V-shaped bottom, or a flat bottom, as shown in FIG. 7A, 7B or 7C, respectively. Meanwhile, one side of the stress equalizing element 3 facing toward the bottom of the receiving hole 213 is configured corresponding to the bottom shape of the receiving hole 213, allowing the stress equalizing element 3 to be completely fitly received in the bottom of the receiving hole 213.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A stress equalized heat sink unit, comprising: a radiating fin assembly consisting of a plurality of spaced parallel radiating fins, wherein at least one section of several consecutive, generally centrally located, radiating fins are cut out at a limited predetermined central portion to form a small receiving opening extending vertically downward a distance from a top of the radiating fin assembly forming a bottom to said opening extending across said central portion of a plurality of adjacent fins, and wherein remaining radiating fins are cut out at other predetermined positions to form two narrow spaced gaps communicating to said receiving opening, and extending vertically downward from the top of the radiating fin assembly by another depth smaller than that of the receiving opening, and a spacing defined between two narrow spaced gaps; wherein the receiving opening defines a width larger than said spacing; and a square flat plate stress equalizing element that is planar on top and bottom positioned in the receiving opening contacting the bottom thereof thereby engaging and being in contact with all of the fins in said receiving opening in said central portion of said plurality of adjacent fins, one side of the stress equalizing element facing away from the bottom of the receiving hole serving as a pressure receiving face, wherein the pressure receiving face receives a downward pressure from a tightening device, and the tightening device has a main body having spaced parallel main members that are configured to press against the pressure receiving face but not the fins and which are fitted in the two narrow spaced gaps in said radiating fin assembly thereby aiding in maintaining the radiating fins in place, wherein the radiating fins are spaced from one another by a fixed distance, and wherein the tightening device has a fastening section arranged at one end of the main body.

2. The stress equalized heat sink unit as claimed in claim 1, wherein the fastening section includes a hook member and a contact face.

3. The stress equalized heat sink unit as claimed in claim 2, wherein the tightening device further includes a control lever connected to the contact face.

4. The stress equalized heat sink unit as claimed in claim 1, the radiating fin assembly further includes at least one heat pipe that is extended through the radiating fins to connect the radiating fins to one another.

* * * * *